(12) United States Patent
Wang et al.

(10) Patent No.: US 8,184,033 B2
(45) Date of Patent: May 22, 2012

(54) HIGH FIDELITY, RADIATION TOLERANT ANALOG-TO-DIGITAL CONVERTERS

(75) Inventors: Charles Chang-I Wang, Milpitas, CA (US); Ivan Richard Linscott, Mountain View, CA (US); Umran S. Inan, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 121 days.

(21) Appl. No.: 12/778,875

(22) Filed: May 12, 2010

(65) Prior Publication Data

US 2011/0169678 A1 Jul. 14, 2011

Related U.S. Application Data

(60) Provisional application No. 61/177,566, filed on May 12, 2009.

(51) Int. Cl.
*H03M 1/38* (2006.01)

(52) U.S. Cl. ......................... 341/161; 341/155

(58) Field of Classification Search .................. 341/155, 341/161, 172
See application file for complete search history.

(56) References Cited

U.S. PATENT DOCUMENTS

| | | | | |
|---|---|---|---|---|
| 7,187,318 | B1 * | 3/2007 | Lee et al. ....................... | 341/161 |
| 7,602,323 | B2 * | 10/2009 | Galton et al. ................. | 341/118 |
| 7,612,700 | B2 * | 11/2009 | Kawahito et al. ............. | 341/161 |
| 7,710,303 | B2 | 5/2010 | Wojewoda et al. | |

OTHER PUBLICATIONS

Edwards, C. F. et al., A Multibit EA Modulator in Floating-Body SOS/SOI CMOS for Extreme Radiation Enviroments, journal, Ieee Journal of Solid-State Circuits, Jan. 22, 1999, pp. 937-948, vol. 34, No. 7, IEEE.

Lee, S. et al., Digital-Domain Calibration of Multistep Analog-to-Digital Converters, journal, Ieee Journal of Solid-State Circuits, Jul. 10, 1992, pp. 1679-1688, vol. 27, No. 12, IEEE.

Mossawir, B. et al., A TID and SEE Radiation-Hardened Wideband, Low-Noise Amplifier, journal, Ieee Transactions on Nuclear Science, Sep. 5, 2006, pp. 3439-3448, vol. 53, No. 6, IEEE.

Nowlin, R. N. et al., A New Total-Dose-Induced Parasitic Effect in Enclosed-Geometry Transistors, journal, Ieee Transactions on Nuclear Science, Sep. 23, 2005, pp. 2495-2502, vol. 52, No. 6, IEEE.

Rivetti, A. et al., A Low-Power 10-bit ADC in a 0.25-mm CMOS: Design Considerations and Test Results, journal, Ieee Transactions on Nuclear Science, Feb. 9, 2001, pp. 1225-1228, vol. 48, No. 4, IEEE.

* cited by examiner

*Primary Examiner* — Brian Young
(74) *Attorney, Agent, or Firm* — Evans & Molinelli PLLC; Eugene J. Molinelli

(57) ABSTRACT

Techniques for an analog-to-digital converter (ADC) using pipeline architecture includes a linearization technique for a spurious-free dynamic range (SFDR) over 80 deciBels. In some embodiments, sampling rates exceed a megahertz. According to a second approach, a switched-capacitor circuit is configured for correct operation in a high radiation environment. In one embodiment, the combination yields high fidelity ADC (>88 deciBel SFDR) while sampling at 5 megahertz sampling rates and consuming <60 milliWatts. Furthermore, even though it is manufactured in a commercial 0.25-μm CMOS technology (1 μm=$12^{-6}$ meters), it maintains this performance in harsh radiation environments. Specifically, the stated performance is sustained through a highest tested 2 megarad(Si) total dose, and the ADC displays no latchup up to a highest tested linear energy transfer of 63 million electron Volts square centimeters per milligram at elevated temperature (131 degrees C.) and supply (2.7 Volts, versus 2.5 Volts nominal).

19 Claims, 8 Drawing Sheets

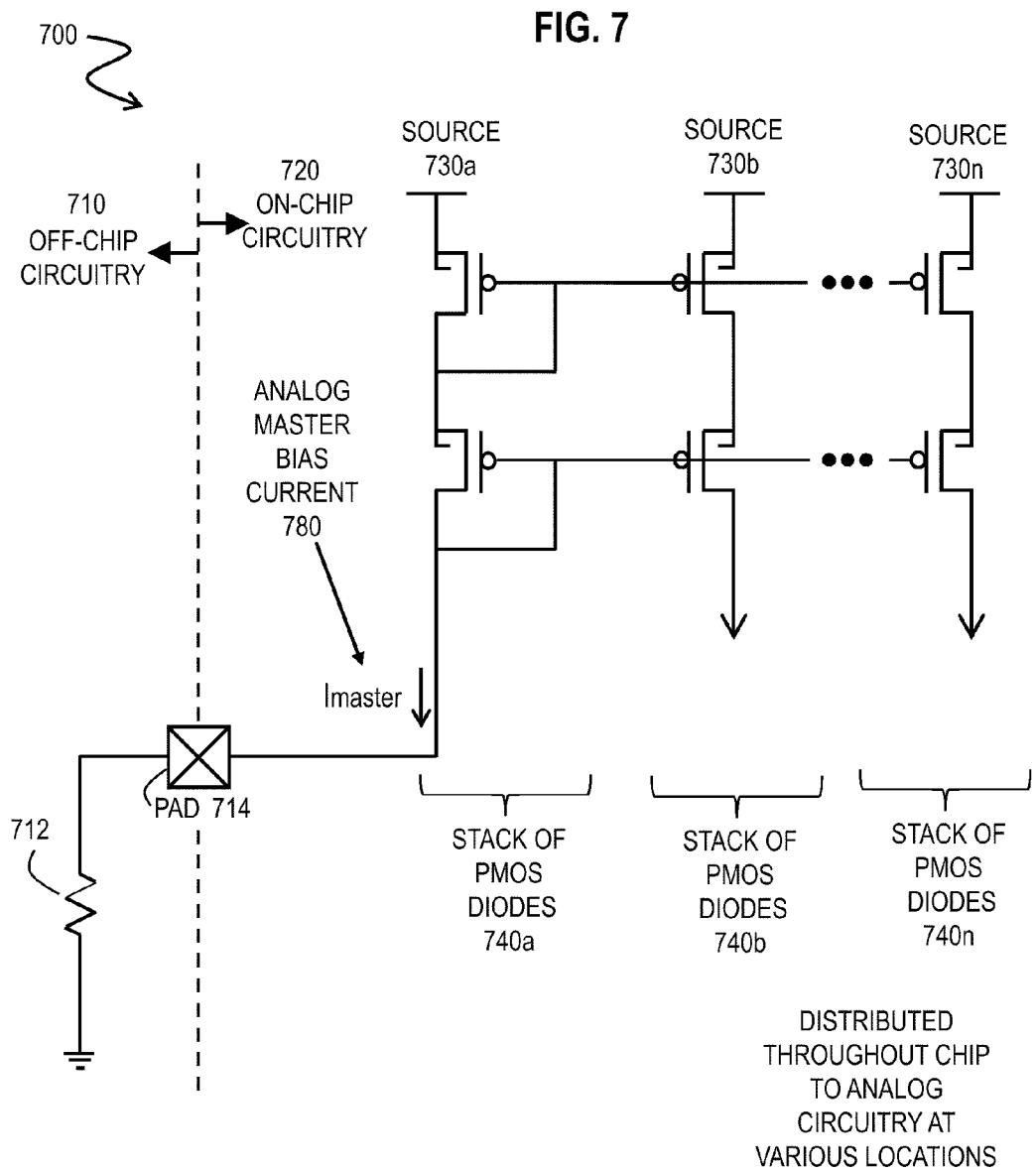

HIGH FIDELITY, RADIATION TOLERANT ANALOG-TO-DIGITAL CONVERTERS

CROSS REFERENCE TO RELATED APPLICATIONS

This application claims benefit of Provisional Appln. 61/177,566, filed May 12, 2009, the entire contents of which are hereby incorporated by reference as if fully set forth herein, under 35 U.S.C. §119(e).

STATEMENT OF GOVERNMENTAL INTEREST

This invention was made with Government support under grant #NAG5-10822 awarded by the National Aeronautics and Space Administration (NASA) and under contract #FA8178-05-C-0027-20 awarded by the Air Force Research Laboratory (AFRL). The Government has certain rights in the invention.

BACKGROUND

Plasma waves guide the space weather of the upper atmosphere, including the radiation belts. With the increasing number of assets orbiting the Earth in these regions, interest in plasma wave dynamics has grown. For example, applications such as radiation belt remediation (wherein damaging enhanced radiation levels are reduced by controlled precipitation of energetic particle populations) have spurred recent research. Satellite missions to measure these phenomena in situ are an integral part of these efforts.

Plasma wave signals span a broad range of powers (over 120 deciBels, dB, where a deciBel expresses a range as ten times the difference between the logarithms of the largest and smallest values) over a broad bandwidth (from 0.1 Hz to 1 megahertz, MHz, where Hertz, Hz, is a cycle per second and 1 MHz=$10^6$ Hz). Furthermore, they evolve dynamically in time (often on millisecond, ms, time scales, where 1 ms=$10^{-3}$ seconds). To capture as much of this signal in situ as possible, instruments are needed that cover broad ranges of sampling rates, durations and dynamic range under conditions of high radiation.

SOME EXAMPLE EMBODIMENTS

Therefore, there is a need for a radiation-hardened analog-to-digital converter (ADC) that captures an input bandwidth of 100 Hz to 1 MHz by sampling at 5 megasamples per second (MS/s, 1 MS=$10^6$ samples) and maintaining a spurious-free dynamic range (SFDR) of at least 90 dB (assuming a Fast Fourier Transform (FFT) bin width of 100 Hz).

According to a first set of embodiments, an analog-to-digital converter (ADC) using a pipeline architecture includes a linearization technique for a spurious-free dynamic range (SFDR) over 80 dB. In some embodiments of the first set, sampling rates exceed a megahertz. In some embodiments of the first set, a stage of the pipeline architecture includes a sufficient number of extra sub-ADC transition levels so that discontinuity heights between adjacent segments in a transfer function is strictly less than an input range of a backend ADC comprising all following stages. In some embodiments of the first set, a stage of the pipeline architecture includes a calibration module configured to produce both a digital-to-analog converter (DAC) code difference and an autozero difference between successive phases in a sampling interval. In some of these embodiments, the stage of the pipeline architecture includes a digital logic module configured to populate a calibration lookup table based on the DAC code difference and the autozero difference.

According to a second set of embodiments, a switched-capacitor circuit is configured for correct operation in a high radiation environment. According to some embodiments of the second set, the switched-capacitor circuit includes enclosed terminal layout for n-type metal-oxide semiconductor (NMOS) components in switches. According to some embodiments of the second set, the switched-capacitor circuit is configured with self-resetting circuitry. In some embodiments of the second set, offset cancellation is incorporated in the self-resetting configuration. In some embodiments of the second set, guard rings are positioned near active components. In some embodiments of the second set, the circuit includes a stack of p-type metal-oxide semiconductor (PMOS) diodes in series with an off chip resister to drive a master bias current. In some embodiments of the second set, the circuit includes operational amplifiers with a bandwidth or gain or both that exceeds operating specifications of the circuit to allow for bandwidth degradation during exposure to high radiation.

According to various other embodiments, methods are performed to build or operate one or more of the apparatus embodiments described above. In some other embodiments, logic embedded in tangible media is configured to populate a calibration lookup table based on a DAC code difference and an autozero difference.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings, in which:

FIG. 7 is a diagram illustrating a source of a master bias current, according to an embodiment.

DETAILED DESCRIPTION OF EXAMPLE EMBODIMENTS

Figure 1:
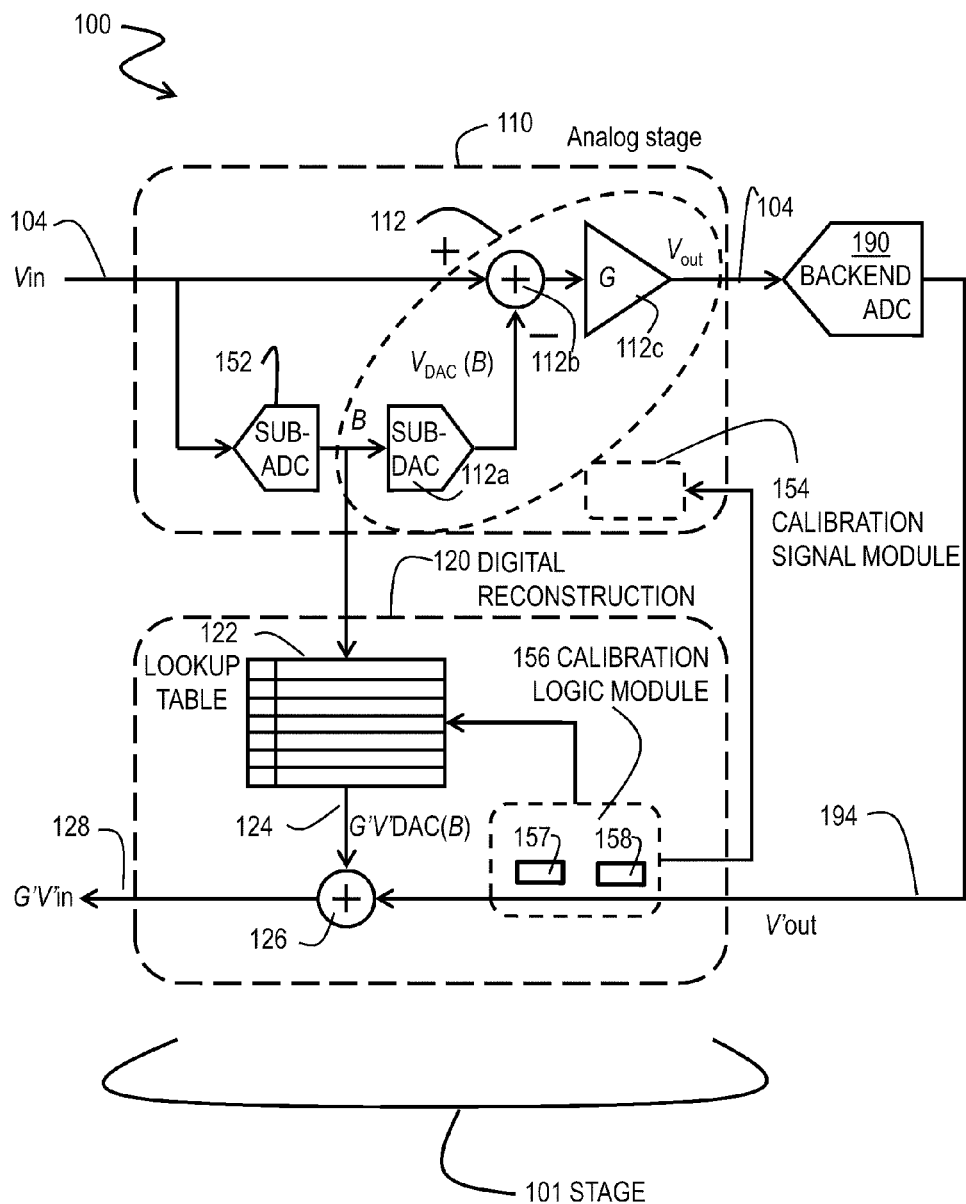
FIG. 1 is a diagram illustrating a stage of a pipelined analog-to-digital converter (ADC), according to one embodiment.

A method and apparatus are disclosed for a radiation tolerant, high fidelity analog-to-digital converter (ADC). In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Although several embodiments of the invention are discussed with respect to a small footprint, low-power, radiation tolerant, high fidelity, megahertz sampling ADC fabricated using low cost, easily accessible commercial CMOS manufacturing processes, embodiments of the invention are not limited to this context. For example, it is explicitly anticipated that in some embodiments the self-calibration technique of this disclosure is extended to a variety of residue amplifier architectures. Furthermore, it is also explicitly anticipated that the radiation-hardness by design techniques of this disclosure are applied, alone or in some combination, to general switched-capacitor circuits, which are used in a variety of applications (e.g., from filters to ADCs). Furthermore both techniques are applicable to circuits designed in other manufacturing processes.

Furthermore, although several embodiments are described with respect to application on satellites for the measurement of plasma waves, applications are not limited to this context. For example, in other embodiments, the techniques described herein are used for other satellite systems, wherever signal digitization is needed (from sensors on scientific instrumentation to digitization on communication links to monitoring for bus housekeeping); in nuclear power plants (e.g., for monitoring systems); in particle accelerators; in nuclear medicine; in systems that must function at high altitudes; and in digital radio and other wideband, high fidelity communication systems (such as orthogonal frequency-division multiplexing, OFDM, systems) where the low power afforded makes it especially attractive in mobile applications.

Several acronyms used herein have the meanings indicated in the following table.

| | |
|---|---|
| A/D | analog-to-digital converter |
| ADC | analog-to-digital converter |
| CMOS | complementary metal-oxide semiconductor circuits combining p-channel and n-channel transistors to implement logic gates and other digital components |
| DAC | digital-to-analog converter |
| FFT | fast Fourier transform |
| FPGA | field-programmable gate array |
| JPL | National Aeronautics and Space Administration (NASA) Jet Propulsion Laboratory |
| LET | linear energy transfer |
| MOSFET | metal-oxide semiconductor field-effect transistor |
| NMOS | abbreviation for NMOSFET, n-channel metal-oxide semiconductor field-effect transistor |
| OFDM | orthogonal frequency-division multiplexing |
| PMOS | abbreviation for PMOSFET, p-channel metal-oxide semiconductor field-effect transistor |
| SFDR | spurious-free dynamic range |

Digital systems include a communication mechanism such as a bus for passing information between other internal and external components of the system. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. In some embodiments, information called analog data is represented by a near continuum of measurable values within a particular range. A bus includes one or more parallel conductors of information so that information is transferred quickly among devices coupled to the bus. One or more processors for processing information and memory for storing information are coupled with the bus.

The memory, such as a random access memory (RAM) or other dynamic storage device, stores information including processor instructions. Dynamic memory allows information stored therein to be changed by the computer system. RAM allows a unit of information stored at a location called a memory address to be stored and retrieved independently of information at neighboring addresses. The memory is also used by the processor to store temporary values during execution of processor instructions. A read only memory (ROM) or other static storage device is coupled to the bus for storing static information, including instructions, that is not changed by the digital system. Some memory is composed of volatile storage that loses the information stored thereon when power is lost. Some memory is composed of non-volatile (persistent) storage device, such as a magnetic disk, optical disk or flash card, for storing information, including instructions, that persists even when the digital system is turned off or otherwise loses power.

Logic encoded in one or more tangible media includes one or both of processor instructions on a computer-readable storage media and special purpose hardware.

Improvements in various embodiments are grouped into two categories described in more detail below, self-calibration technique for achieving the high linearity implied by the desired SFDR, and the application of radiation-hardness-by-design techniques for achieving the radiation tolerance.

1. Self Calibration

The ADC uses a pipeline architecture. Circuit limitations and manufacturing variations, though, typically limit these architectures to 8-bit to 10-bit resolution. This in turn limits linearity: SFDR is typically just 70 to 80 dB. The novel self-calibration technique, then, presents an economical way to overcome these limitations while incurring minimal increase in power consumption, circuit area, and circuit complexity. Specifically, the self-calibration technique configures and measures the discontinuity heights between adjacent segments of the stage transfer function in novel ways.

A pipeline converter accomplishes quantization through a series of pipeline stages. FIG. 1 is a diagram illustrating a stage 101 of a pipelined analog-to-digital converter (ADC) 100, according to one embodiment. It encompasses an analog stage 110 and accompanying digital reconstruction 120. The analog stage quantizes its analog input Vin 104 through a coarse sub-ADC, generating the digital output B. Through a subsequent residue amplifier 112 comprising a sub-DAC 112a, subtraction element 112b, and gain element (amplifier) 112c, the analog stage then generates a gained version of the quantization error of that coarse quantization—dubbed the analog output residue Vout 104—which is passed on to any subsequent stages (here represented as a backend ADC 190) for further quantization. The DAC outputs a nominal voltage for each digital ouput B value. To construct a digital estimate of Vin, then, the operation of the analog stage is simply reversed in the digital reconstruction 120: a lookup table 122 supplies a sub-DAC voltage 124 (digitally gained by G') corresponding to digital output B, and the backend ADC 190 provides V'out 194, the quantized version of Vout 104, which are combined in adder element 126 as shown to produce G'V'in 128, a quantized version of the analog input Vin 104. Notably, it is inconsequential here that V'in is gained by digital gain G' because this linear gain can be easily adjusted and does not harm conversion accuracy.

Techniques that use DAC differences (residue amplifier 112, for instance) to calibrate residue amplifiers 112 that are biphasic are not new. However, direct applications of the principle to standard pipeline stages result in DAC difference outputs from residue amplifier 112 that easily exceed a linear range of the next stage (e.g., backend ADC 190). The accompanying increase in estimation error renders the technique useless from a practical perspective for multiple stage ADCs.

To overcome this deficiency, one previous technique opted to decrease the stage gain G supplied by amplifier 112c, diminishing all discontinuity heights in the analog signal (e.g., output from sub-DAC 112a). While useful for the two-step converter it was applied to, this technique is not practical for pipeline converters, since when applied to multiple stages it severely decreases converter resolution. The combined gain of all the stages, combined with the resolution of the final sub-ADC, determines the overall resolution of the entire pipeline converter. Hence the desired resolution sets the product of the gains of all the stages. For any one stage, the gain G is typically selected by a broad-ranging optimization that takes into account power, speed, accuracy, noise, and the capabilities of the manufacturing process. Typically, the result is a stage gain of $2^n$, for some integer n, and a transfer function wherein the discontinuities are of height VREF. Such stages are considered efficient in that they provide sub-ADC error tolerance while retaining simple digital reconstruction implementations. Changing the gain G changes the overall pipeline resolution.

Alternate solutions include capacitor-splitting and capacitor-based offsetting. In the former, sample capacitors are divided into smaller capacitances and the final DAC difference estimate constructed from the sums of such differences over the smaller capacitors. In the latter, an offset sample capacitor decreases the residue amplifier output during the DAC difference estimate. The offset is then lumped into the autozero measurement. However, in both these techniques, the actual DAC codes of sub-DAC 112a are no longer applied during calibration, and thus these techniques are vulnerable to differences in loading and clocking effects between nominal and calibration operation.

Figure 2A:
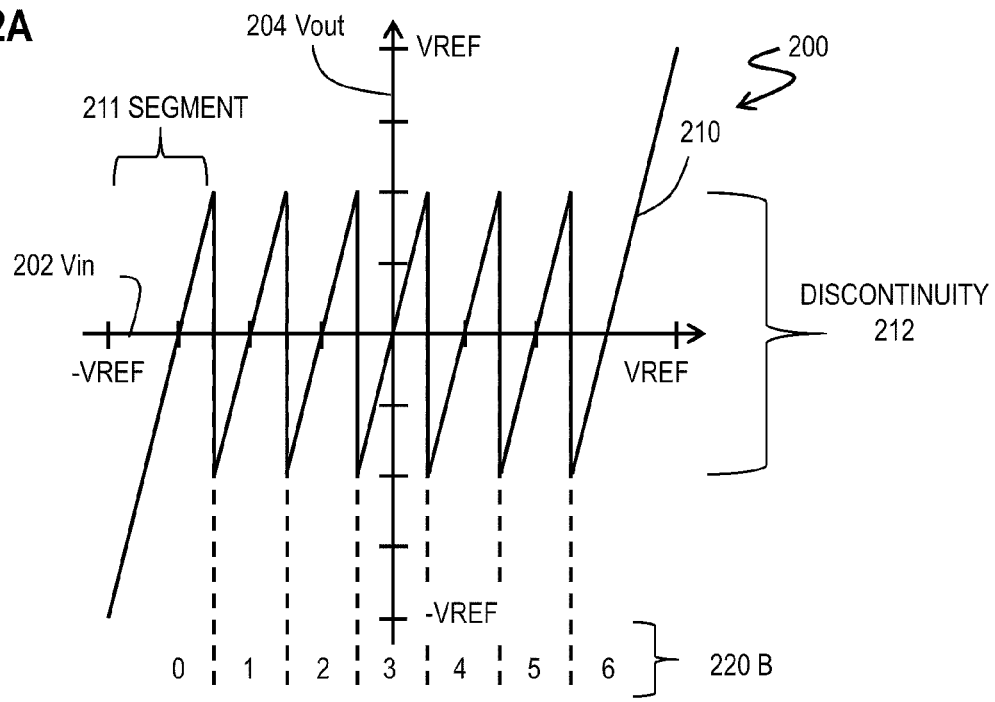
FIG. 2A and FIG. 2B are diagrams that illustrate voltage outputs by segments of a transfer function of a sub-ADC from one stage of a pipelined ADC, according to two embodiments.
Figure 2B:
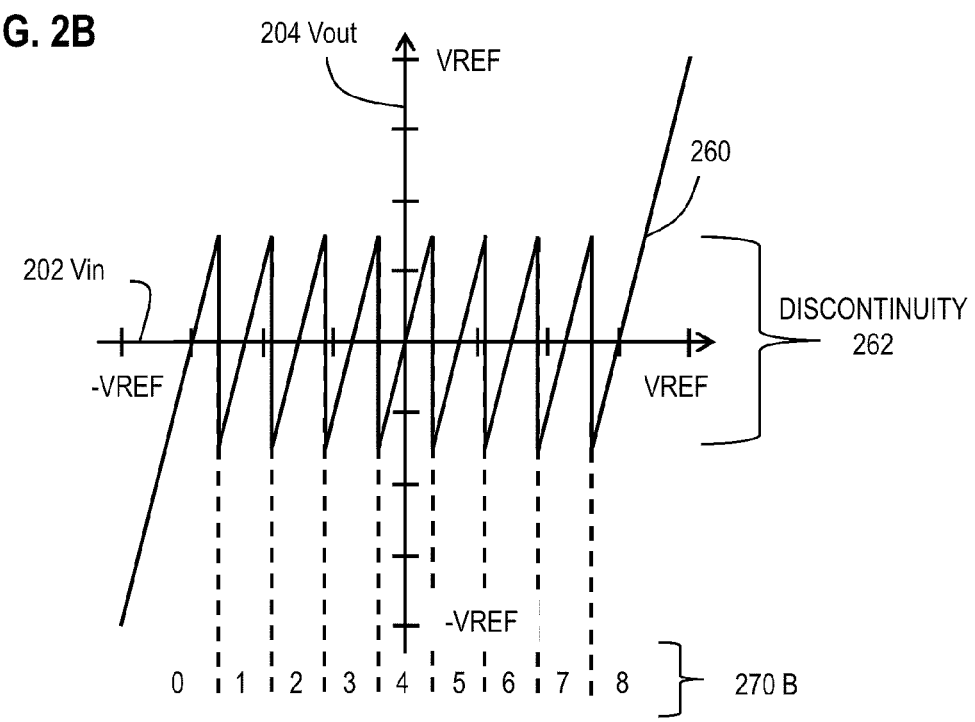

In a new approach applied in some embodiments, configuration of a stage is designed with a modified transfer function that has a sufficient number of extra sub-ADC transition levels and corresponding sub-DAC codes that the discontinuity height between adjacent segments in the transfer function is strictly less than the input range of the backend ADC 190. For example, a traditional 2.8-bit stage transfer function can be modified by adding 2 extra segments. As a result, the discontinuity heights of the new stage are reduced from VREF to just 0.75 VREF where VREF is a reference voltage. FIG. 2A and FIG. 2B are diagrams 200 and 250, respectively, that illustrate voltage outputs by segments of a transfer function for one stage of a pipelined ADC, according to two embodiments. The horizontal axis 202 is Vin; and the vertical axis 204 is Vout. Both a trace of the analog output Vout and bins of digital output B are shown. The analog voltage discontinuity from the end of one digital bin to the beginning of the next is shown. FIG. 2A shows the transfer function 210 of the original 2.8-bit stage, including a residue amplifier gain of 4, 6 sub-ADC transition levels at Vin values of $[-5/8, -3/8, -1/8, 1/8, 3/8, 5/8] \cdot$ VREF, and 7 sub-DAC output levels (nominal voltages) at Vin values of $[-3/4, -2/4, -1/4, 0, 1/4, 2/4, 3/4] \cdot$ VREF, resulting in discontinuities each dropping from +VREF/2 to −VREF/2, for a discontinuity height of VREF. FIG. 2B shows the transfer function 260 of modified sub-ADC 152 of the resulting 3.1-bit stage, including the same residue amplifier gain, but 8 sub-ADC transition levels at Vin values of $[-21/32, -15/32, -9/32, -3/32, 3/32, 9/32, 15/32, 21/32] \cdot$ VREF, and 9 sub-DAC output levels (nominal voltages) at Vin values of $[-24/32, -18/32, -12/32, -6/32, 0/32, 6/32, 12/32, 18/32, 24/32] \cdot$ VREF, resulting in discontinuities each dropping from $+(VREF)*3/8$ to $-(VREF)*3/8$, for a discontinuity height of $VREF*3/4$ (0.75 VREF). Function 250 is generated from a device that has transfer function 200 by adding two extra segments by adding two extra transition levels in stage sub-ADC 152 and two extra output levels (nominal voltages) in stage sub-DAC 112a.

Adding stage segments to decrease the nominal sub-DAC difference output is not previously known. This allows the stage 101 to maintain its gain G and also allows the actual DAC codes in sub-DAC 112a to be used during calibration. Any number of segments can be added in other embodiments. In the illustrated embodiment of FIG. 2B, 2 segments are added to reduce the discontinuity height to three-quarters nominal. Adding segments to reduce discontinuity height offers the advantage of maintaining the stage gain and, thus, maintaining the overall ADC resolution without requiring additional stages and still enabling calibration to improve the fidelity of the ADC.

Segments are added by adding transition levels to, and adjusting the existing levels of, the sub-ADC, e.g., by adding comparators; and by adding output levels to, and adjusting the existing output levels of, the sub-DAC so that they are at the zero-crossings of the new transfer function, such as that shown in FIG. 2B. At the circuit-level, it depends on the particular circuits used to implement the sub-ADC and sub-DAC. For example, for the residue amplifier of FIG. 3A, described below, which implements the sub-DAC, adding another segment would involve increasing R by 1 and then adjusting the ratios of the Cr+ and Cr− capacitors, r=1, . . . , R, with the CF+ and CF− capacitors. For the vast majority of sub-ADC and sub-DAC embodiments, the needed addition and adjustment is readily discerned by one of ordinary skill.

In a second, complementary approach used in some embodiments, the reconfigured stage 101 is augmented with additional components to generate, detect and use additional calibration signals. The additional components include a calibration signal module 154 interfacing with the residue amplifier 112 by means of additional circuitry described below, and a calibration logic module 156 to control the calibration signal module 154 and correct the lookup table 122 of the standard digital reconstruction based on the new calibration signals using a method described in more detail below.

It is well known that the quantization accuracy of a pipeline converter is limited by the matching between corresponding parameters in the analog stage and digital reconstruction, and in particular by mismatches between the sub-DAC 112a and gain 112c blocks of the analog stage 110 and the lookup table 122 of the digital reconstruction circuit 120. These can arise due to circuit limitations and manufacturing variations. This typically limits pipeline converters to 8-bit to 10-bit resolution, which in turns limits linearity: SFDR is typically just 70 dB to 80 dB.

In the illustrated embodiment, a self-calibration technique is employed that provides an economical way to overcome the known limitations while incurring minimal increase in power consumption, circuit area, and circuit complexity. Specifically, the technique measures the discontinuity heights between adjacent segments of the stage transfer function. These discontinuity heights encompass the entire meaningful mismatch between a) the sub-DAC 112a and gain 112c blocks of the analog stage 110, and b) the lookup table 122 of the digital reconstruction circuit 120. These measurements are used to update the digital reconstruction lookup table 122. By introducing the novel stage transfer function modification of adding extra segments as previously detailed, the self-calibration technique can now directly measure the discontinuity heights by direct differencing of DAC codes, instead of relying on the use of additional input voltages or indirect measurements requiring additional digital processing (as in capacitor-splitting and capacitor-based offsetting).

Figure 3A:
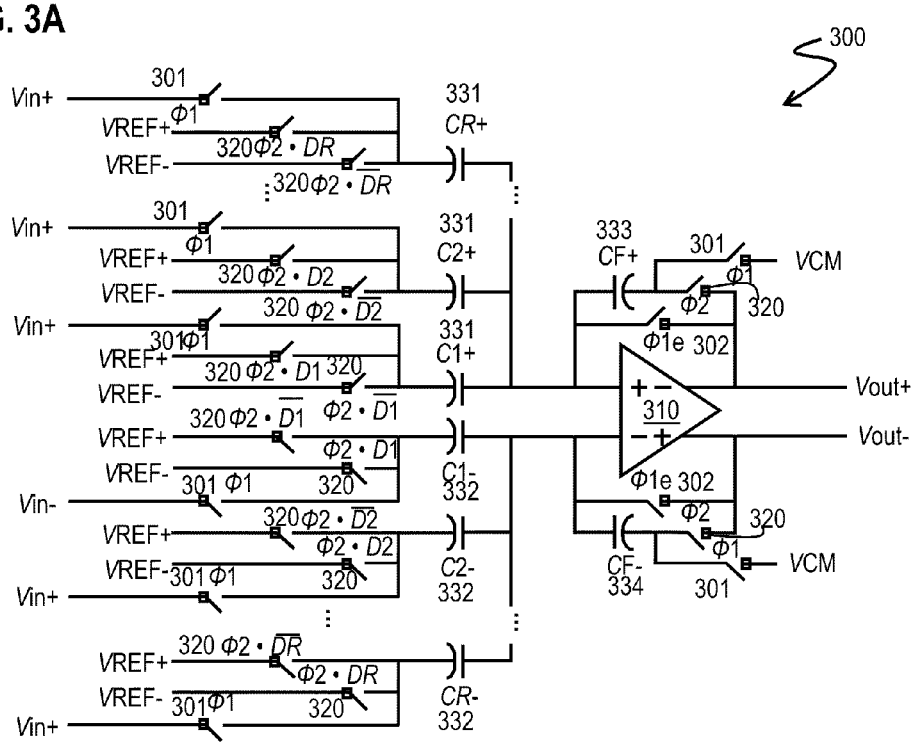
FIG. 3A is a diagram illustrating an analog residue amplifier of FIG. 1, according to one embodiment.
Figure 3B:
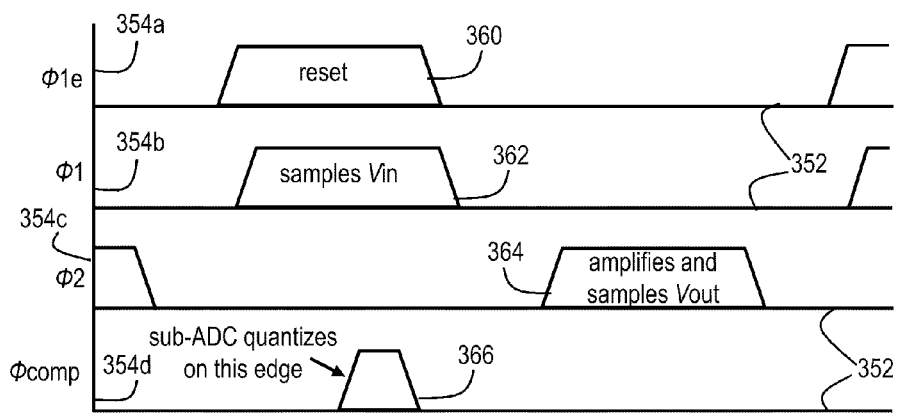
FIG. 3B is a timing diagram illustrating timing of phases of operation of the analog reside amplifier of FIG. 3A.

The actual calibration of the stage 101 revolves around the stage residue amplifier 112, which is typically a biphasic amplifier that implements the sub-DAC 112a, subtraction 112b, and gain 112c blocks of the analog stage 110. A modified amplifier is shown in FIG. 3A and FIG. 3B. FIG. 3A is a diagram illustrating a modified analog residue amplifier 300 used as residue amplifier 112 of FIG. 1, according to one embodiment; and FIG. 3B is a timing diagram 300 illustrating timing of phases of operation of the analog reside amplifier 300 of FIG. 3A. An example of a fully-differential circuit implementation 300 is shown in FIG. 3A with modifications for enhanced calibration using a reference signal VREF. Modified analog residue amplifier 300 includes operational amplifier 310, switches 301, 302 and 320, and capacitors 331, 332, 333 and 334, as well as leads carrying one or more voltage differences. Vin=Vin+−Vin−; Vout=Vout+−Vout−; and VREF=VREF+−VREF−. Conceptually, VREF is used to set the decision levels of the sub-ADC and the output levels of the sub-DAC: all these levels are designed to be fractions of VREF. The ratios of the various capacitors are determined by the desired sub-DAC output levels. The specific value of a capacitor (once one is chosen, all the rest are determined by said ratios) is chosen based upon a broad system-level optimization. What is shown in FIG. 3A is one particular embodiment of a residue amplifier, including sub-DAC 112a, subtractor 112b and gain block 112c. Different embodiments are possible.

In FIG. 3B, the horizontal axis 352 is time and four vertically offset vertical axes 354a, 354b, 354c and 354d indicate the size of control signals (such as voltages that close switches). The signal that closes switches 302 ($\phi 1e$) near the amplifier 310 is plotted on vertical axis 354a as trace 360. The signal that closes switches 301 ($\phi 1$) is plotted on vertical axis 354b as trace 362. The signal that closes switches 320 ($\phi 2$) is plotted on vertical axis 354c as trace 364. The signal that operates sub-ADC 152 (in FIG. 1) is called $\phi$comp and is plotted on vertical axis 354d as trace 366 for timing reference.

During normal operation, the residue amplifier 300 processes Vin during the sample phase (time during which $\phi 1$ signal 362 and $\phi 1e$ signal 360 are positive). During the amplify phase (time during which $\phi 2$ signal 364 is positive), a certain set of the capacitors Cr+ 331, r=1, ..., R are switched to VREF+, the remainder are switched VREF− (the corresponding Cr− 332 are switched to VREF− and VREF+, respectively) as shown in FIG. 3A. The particular set of Cr+ switched to VREF+ is determined by the sub-ADC decision. In this way, Hence, given a particular sub-ADC result, the residue amplifier 300 produces a particular sub-DAC output voltage by switching a particular set of Cr+ capacitors to VREF+. The particular set of Cr+ capacitors thus switched is said to implement a particular DAC code, where the DAC code is the sub-DAC input. In addition, the amplifier 310 is configured to provide an overall gain during the amplify phase.

Under calibration by the calibration logic module 156, the stage residue amplifier 112 is reconfigured to reroute signals internal to the stage 101. In particular, two types of calibration configurations are used: a DAC difference configuration and an autozero configuration. In a configuration called "DAC difference" the calibration signal module 154 causes the residue amplifier 300 to implement DAC code m+1, corresponding to the m+1 segment, during the sample phase ($\phi 1$) and a DAC code m corresponding to the m segment, during the amplify phase ($\phi 2$). The residue amplifier output during the amplify phase is thus the height of the discontinuity between these two transfer function segments. In a configuration called "autozero", the calibration signal module 154 causes the residue amplifier 300 to implement the same DAC code, say DAC code 0, during both phases. In each calibration configuration, the modified residue amplifier 300 with calibration signal module 154 is kept in the configuration for several cycles. Its output is then measured by the backend ADC and averaged to arrive at the calibration logic module 156 where the DAC difference and autozero estimates are derived.

Conceptually, during calibration, calibration signal module 154 interrupts the signals to the subtractor 112 band reroutes various output levels of the sub-DAC 112a to be input to the subtractor 112b as per the desired DAC difference or autozero configuration. In residue amplifier 300 implementing these configurations simply involves retiming the switches 301 and 320: during calibration, switches 301 are never closed/connected and switches 320 are closed/connected so that they correspond to one DAC code during the sample phase, and another (under the DAC difference configuration) or the same (under the autozero configuration) DAC code during the amplify phase. The control of the switches is handled by calibration signal module 154, as directed by the calibration controller 158 embedded in calibration logic module 156.

The stage 101 digital reconstruction circuit 120 is implemented with a lookup table 122. The procedure is implemented in calibration logic module 156 configured to execute five steps. In step 1, the first entry of the stage lookup table is set to an initial offset (typically 0). In step 2, while the autozero configuration is adopted, the autozero output from the backend ADC is derived, typically by averaging the output of the backend ADC over several cycles, and stored in a cache 157 within the calibration logic module 156. In step 3, while the DAC difference configuration using the first two DAC codes (i.e. DAC code 1 during the sample phase, 0 during the amplify phase) is adopted, a DAC difference output is received from the backend ADC, and an estimate is derived in the calibration logic module 156, typically by averaging the output of the backend ADC over several cycles, and the stored autozero estimate in cache 157 is subtracted from this DAC difference estimate. The first entry of the stage lookup table is added to this estimate and the sum result is stored as the second entry of the stage lookup table 122. In step 4, while the DAC difference configuration for the next two DAC codes are adopted, the appropriate DAC difference output is received from the backend ADC, and an estimate is derived in the calibration logic module 156, typically by averaging the output of the backend ADC over several cycles, and the stored autozero estimate is subtracted from this DAC difference estimate. The result of the previous (i.e. last-entered) lookup table entry is added to this estimate and the sum is stored as the next entry of the stage lookup table 122. In step 5, step 4 is repeated until estimates are made for all adjacent pairs of DAC codes. The new values in the lookup table 122 are used to calibrate the digital signals B received during the next round of sampling.

Calibration is performed at startup. So long as the stage 101 analog circuit blocks 110 remain the same, calibration need not be performed again. If analog circuit blocks 110 component values change, though, and in particular if the analog component values associated with the stage residue amplifier 112 change, then calibration can be repeated. For example, such changes may occur with large temperature changes or due to accumulated radiation dose effect. In various embodiments, any schedule or condition may be used to initiate the calibration process. For example, in some embodiments, the calibration process is initiated every few hours or upon detection of a certain radiation dose or temperature change. In the satellite applications, the ADC is often kept off when not in use to conserve power, and recalibration is performed every time the ADC is turned on.

The overhead incurred by the technique is simply some additional digital logic 154 in the stage switches (to implement the calibration configurations) on the analog side (in particular, it requires no additional analog hardware, as it simply repurposes already existent switches). The calibration logic module 156 includes another control module 158 that directs and coordinates the calibration signal module 154 and the calibration logic module 156. When calibration is invoked, the control module 158 dictates which lookup table 122 entry is being worked on, and adjusts the calibration signal module 154 appropriately. As this controller 158 is a digital system, in practice it is incorporated into the calibration logic module 156.

Modification to the digital reconstruction block 120, involves only some control logic to direct calibration, and signal processing for producing the autozero estimate and DAC difference estimates from the output 194 of the backend ADC 190. The signal processing can be very simple: if averaging is used, the technique adds a simple averager (typically over $2^N$ samples, N a positive integer, to simplify implementation) and some adders and registers. As such, the technique allows pipeline converters to overcome circuit limitations and manufacturing variations without resorting to power-hungry methods such as increasing device and capacitor sizing.

Using the lookup table 122 entries measured and filled in this way offers the advantage of more accurate calibration than using a fixed lookup table.

2. Radiation Hardness-By-Design

Radiation-hardness by design encompasses a combination of design choices in implementing the analog circuits 110 of the pipeline, including one or more of: A. Enclosed terminal layout; B. Self-resetting circuitry; C. Latchup prevention; D. Stable generation of master bias current; and E. Analog overdesign.

A. Enclosed Terminal Layout

The enclosed terminal layout has been previously noted for its proficiency in eliminating radiation-induced leakage current. As such leakage would compromise performance of switched-capacitor circuitry, enclosed terminal layout is used for the n-channel metal-oxide semiconductor (NMOS) components in the switches of such circuits, including the residue amplifier 300 with switches 301, 302, 320, and comparators.

Figure 4:
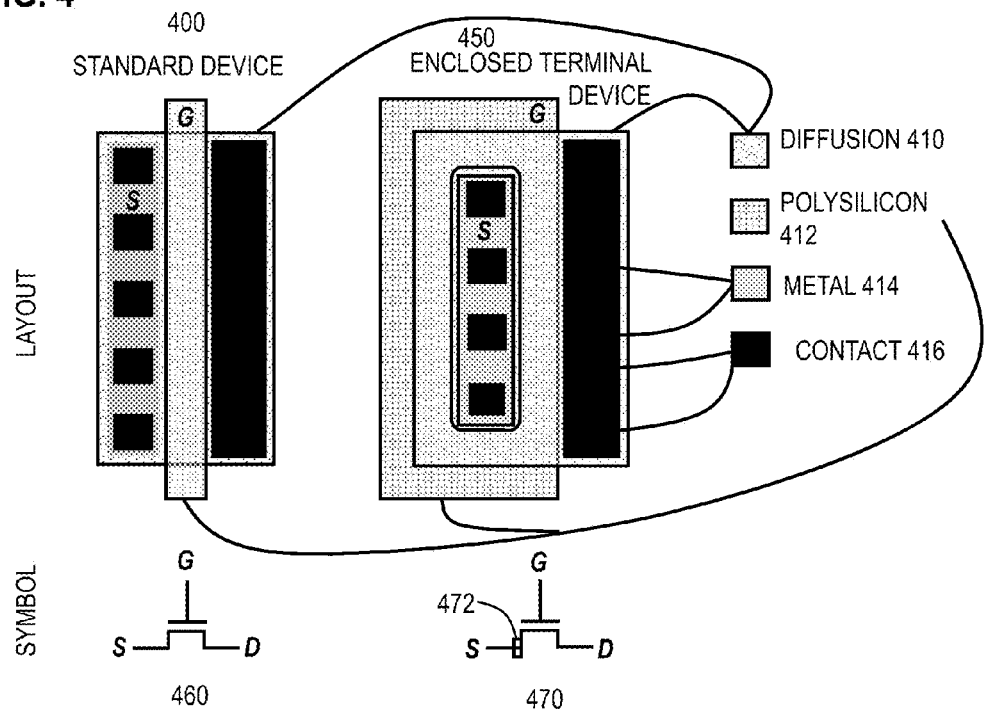
FIG. 4 is a diagram illustrating a difference between a standard and an enclosed terminal layout of an n-type metal-oxide semiconductor (NMOS) component and associated symbols, according to one embodiment.

FIG. 4 is a diagram illustrating a difference between a standard and an enclosed terminal layout of an n-type metal-oxide semiconductor (NMOS) component and associated symbols, according to one embodiment. FIG. 4 shows the device layouts and also adds the corresponding terminal symbols. The source terminals are labelled S, the drain terminals labelled D and the gate labelled G. Standard layout device 400 is shown to the left; enclosed terminal device 450 is shown to the right. The devices include a diffusion layer 410, a polysilicon gate material 412 that receives the gate signal, a metal layer 414 and contacts 416. In the enclosed terminal device 450, the polysilicon gate material 412 surrounds one of the terminals (source or drain). In the illustrated embodiment, the source terminals are enclosed by the polysilicon material 412. In other embodiments, the drain terminals are enclosed by the polysilicon material 412.

Circuit diagram symbols 460, 470, respectively, for both devices are shown at bottom. The enclosed terminal is indicated by a box 472 affixed to the appropriate terminal of the NMOS device. In symbol 470, the box 472 is affixed to source terminal S. These enclosed terminal components are then combined with a p-channel metal-oxide semiconductor (PMOS) components to form complementary metal-oxide semiconductor (CMOS) switches φ as shown in FIG. 5.

Figure 5:
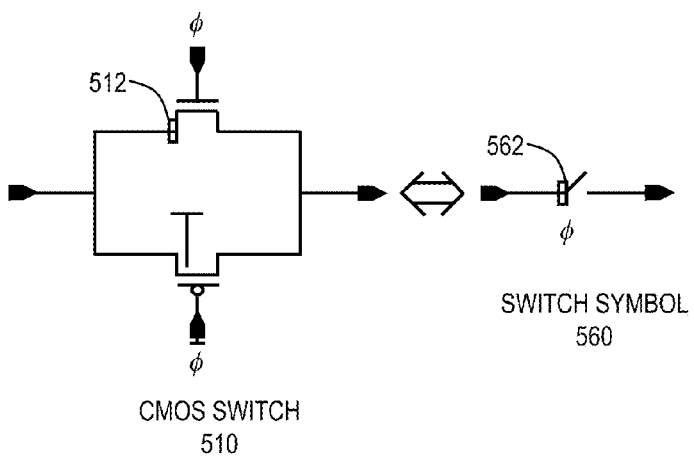
FIG. 5 is a diagram of a complementary metal-oxide semiconductor (CMOS) switch constructed using an enclosed terminal NMOS component and associated symbol, according to an embodiment.

FIG. 5 is a diagram of a complementary metal-oxide semiconductor (CMOS) switch 510 constructed using an enclosed terminal NMOS component, and associated symbol 560, according to an embodiment. In the switch symbol 560, the enclosed terminal 512 of the NMOS device is indicated by a box 562 affixed to the appropriate switch terminal. These switch symbols 560, then, are used in the residue amplifier 300 example of FIG. 3A and give the orientation of the asymmetric enclosed terminal devices used there. Because the enclosed terminal 562 is asymmetric, care is taken in orienting the enclosed terminals 562. This is indicated in the sample residue amplifier 300 by a small box at the base of each switch 301, 302, 320 identifying the enclosed terminal. The enclosed terminal is always driven by a low-impedance source to reduce the impact of extra parasitic capacitance to which such enclosed terminals are susceptible. Furthermore, the enclosed terminal is never associated with an operational amplifier input, to reduce charge sharing impact on this sensitive node.

This is believed to be the first use of the enclosed terminal layout 450 in a switched-capacitor circuit design, like the residue amplifier 300. Traditionally, annular component layouts have been used. The enclosed terminal layout, though, has advantages in that it displays less asymmetry than the annular layout. Furthermore, as it cleaves closer to the standard component layout, a model for the enclosed terminal component is easier to derive from the standard component model provided by a manufacturer. This promotes practical use of the device in analog circuits.

B. Self-Resetting Circuitry

To prevent charge accumulation on nodes due to radiation strikes, every node of the circuit is designed to be driven by a strong low-impedance source at least once a cycle. A circuit node is any point where two or more circuit elements meet. This is efficiently done by the use of self-resetting switched-capacitor circuitry, wherein the strong currents of the amplifiers themselves are used for this purpose. In particular, the input nodes of the amplifier 310 are driven by a strong low-impedance source at least once a cycle by shorting the input and output terminals of the amplifier 310 by closing switches 302. In addition, offset cancellation is incorporated into the self-resetting configurations to cancel 1/f noise. Radiation-induced increases in 1/f noise would otherwise compromise ADC low-frequency performance at high doses.

C. Latchup Prevention

Latchup refers to inadvertent creation of a low-impedance path between the power supply rails of a metal-oxide semiconductor field-effect transistor (MOSFET) circuit, triggering a parasitic structure which disrupts proper functioning of the part and possibly even leading to its destruction due to overcurrent. High radiation can cause latchup.

Figure 6A:
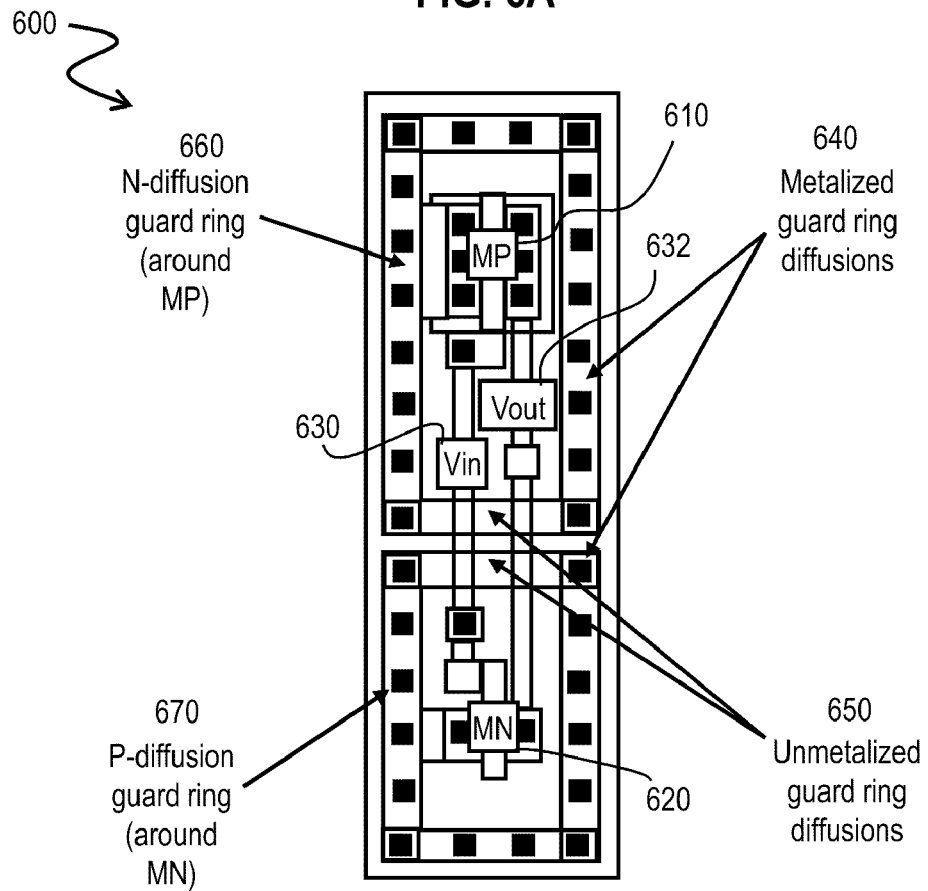
FIG. 6A is a diagram illustrating use of guard rings on a CMOS component, according to an embodiment.

To prevent latchup, extensive guard rings are placed near active components. FIG. 6A is a diagram 600 illustrating use of guard rings 660, 670 on a CMOS component, according to an embodiment. In FIG. 6A guard rings, identified as 660 N-diffusions around the PMOS component MP 610 and 670 P-diffusions around the NMOS component MN 620, are illustrated for an inverter, a basic circuit building block. The inverter includes a Vin contact 630 and a Vout contact 632. Wherever possible, the guard ring diffusions are metalized, such as metalized guard ring diffusions 640 to further reduce their parasitic electrical resistance. However, in some embodiments, the metallization is omitted to allow wiring while maintaining the ring. This configuration is seen in the unmetallized diffusions 650 between the NMOS and PMOS devices. As proposed, the use of guard rings is a general layout technique used throughout the design, and can be applied to any circuit or component.

Figure 6B:
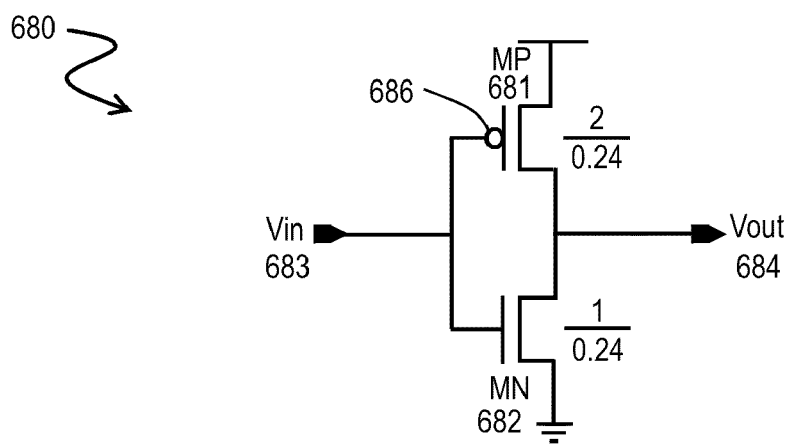
FIG. 6B is a diagram illustrating a schematic representation of guard rings on this CMOS component, according to an embodiment.

FIG. 6B is a diagram 680 illustrating a schematic representation of guard rings 686 on this CMOS component comprising Vin 683, Vout 684, MP 681, MN 682, according to an embodiment.

D. Stable Generation of Master Bias Current

Many devices experience power consumption increases with radiation. To counter this, the master analog current of the ADC is produced as depicted in FIG. 7. FIG. 7 is a diagram 700 illustrating a source of a master bias current 780, according to an embodiment. In FIG. 7, an off-chip resistor 712 is depicted which proved more convenient in lab testing. The master current 780 is derived from a stack of PMOS diodes (e.g., PMOS diodes 740a, 740b, . . . 740n) in series with a current source (e.g., sources 730a, 730b, . . . 730n). As the threshold voltage of PMOS devices only increases in absolute value with radiation (versus an NMOS device, whose threshold voltage may increase or decrease), the master current 780 will only decrease with radiation as the PMOS diodes require ever higher threshold voltages to pass the current. This helps limit analog power consumption with increasing radiation dose.

E. Analog Overdesign

Analog circuits are overdesigned in select regards, for example, the bandwidth and gain of the operational amplifiers are extended to compensate for radiation-induced transconductance degradation. As such overdesign does tend to increase power consumption, it is used selectively throughout the design.

3. Example Embodiments

Figure 8:
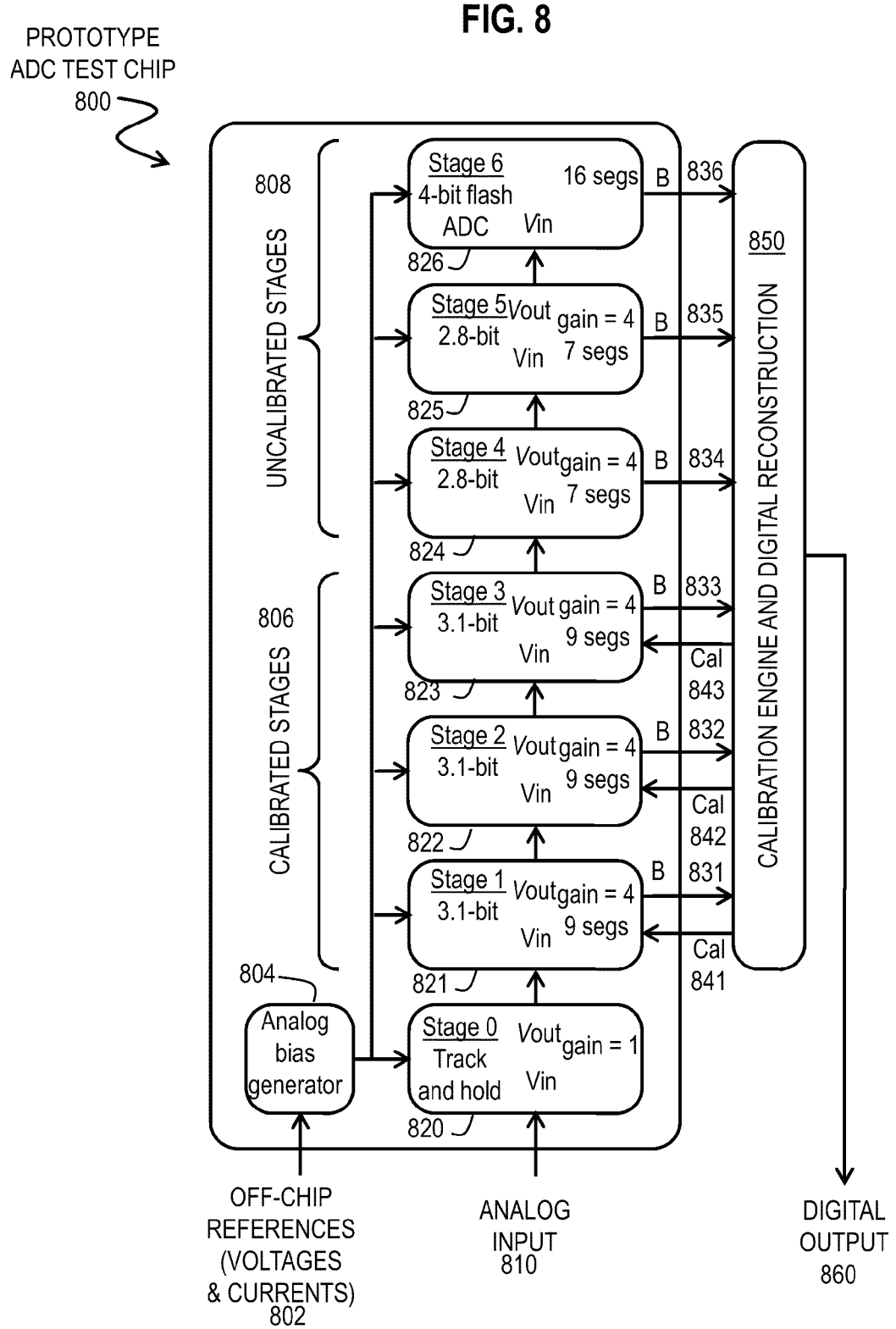
FIG. 8 is a diagram that illustrates an architecture of a high fidelity, radiation tolerant ADC, according to an embodiment.

FIG. 8 is a diagram that illustrates the architecture of a high fidelity, radiation tolerant ADC 800, according to an embodiment. This prototype ADC 800 was used to measure performance listed in Tables 1 and 2. The generation of the master bias current (Imaster) as depicted in FIG. 7, as well as other reference signal generation, is included in "Analog bias generator" block 804 based on input voltages and currents 802.

The prototype ADC 800 includes seven pipelined stages 820 through 826, numbered 0 through 6, respectively. The corresponding blocks 120 in FIG. 1 are depicted as a monolithic calibration engine and digital reconstruction circuit block 850. Stage 0 records portions of the analog input 810, tracks those portions, and feeds those portions forward into the next stage 821. Stages 821, 822 and 823 are calibrated stages 806 and stages 824, 825 and 826 are uncalibrated stages 808.

The calibrated stages 806 are modified according to FIG. 1 with extra segments to provide 3.1 bit resolution (9 segments numbered 0 through 8 and abbreviated "segs" in FIG. 8), as depicted in FIG. 2B. Calibration signals 841 through 843 are generated by block 850 in corresponding calibration logic modules 156 (FIG. 1) and sent to corresponding calibration signal modules 154 (FIG. 1) in the stages 821 through 823. The digital output B is shown as B signals 831, 832 and 833 from the corresponding analog stages to the corresponding digital reconstruction blocks 120 in block 850. In the depicted embodiment three calibrated stages are included. The number of calibrated stages depends on the desired amount of correction. If finer correction is needed, more stages can be calibrated, if coarser correction is needed, fewer stages can be calibrated. The amount of correction depends on the desired SFDR and the inherent SFDR achieved by the pipeline in an uncalibrated state. Any method may be used to determine the number of calibrated stages. In an example embodiment, the number of calibrated stages was determined using extensive Monte Carlo simulations.

Well known 2.8 bit analog stages (composed of 7 segments numbered 0 through 6) as depicted in FIG. 2A are used for stages 824 and 825 in the uncalibrated stages 808. A well known 4-bit flash ADC (with 16 segments) is used in stage 826; stage 826 does not include a residue amplifier. The binary outputs of the uncalibrated stages are shown as B signals 834, 835 and 836. The combined digital output from all stages is provided by block 850 and depicted as digital output 860.

This prototype ADC 800 provides high fidelity (>90 dB SFDR) signal conversion while sampling at megahertz rates (5 MS/s) and consuming low power (<60 milliWatts, mW, 1 mW=$10^{-3}$ Watts). Furthermore, even though it is manufactured in a commercial 0.25-μm CMOS technology, it maintains similar performance in harsh radiation environments. Specifically, such performance is sustained through 1 megarad (Mrad, 1 Mrad=$10^6$ rads, 1 rad=the dose causing 100 ergs of energy to be absorbed by one gram of matter, Si) total dose, and sustained to 2 megarad—the highest tested dose—with only slight decreases in performance (>88 dB SFDR and <61 milliWatts). The prototype ADC 800 displays no latchup up to a linear energy transfer (LET) of 63 million electron-Volts square centimeter per milligram (MeV-$cm^2$/mg), the highest tested LET, at elevated temperature (131 degrees C.) and supply (2.7 Volts, V, versus 2.5 V nominal).

Table 1 illustrates performance of the ADC 800. In Table 1, note (a) indicates measured at 100 Hz/bin; (b) indicates assessed over 100-Hz to 1-MHz evaluation bandwidth; (c) indicates assessed over 100-Hz to 1.2-MHz evaluation bandwidth; (d) indicates evaluated over input frequencies from 103.712 Hz to 366.007 kHz; (e) indicates performance up through 2 Mrad(Si), if single value given, and, if dual values given, first value represents performance up through 1 MRad(Si) and second value performance up through 2 Mrad(Si); (f) indicates Weibull parameters given, where $F(x)=A[1-\exp\{-((x-x0)/c)m\}]$, where x is the LET, for ADC converting a 0.5 direct current voltage (VDC) input signal.

TABLE 1

Operational characteristics of example embodiment.

| Characteristic | Baseline Performance | | Radiation Performance [e] | |
|---|---|---|---|---|
| | Calibrated | Uncalibrated | Calibrated | Uncalibrated |
| Technology | 0.25-mm CMOS, 1P5M, nonepitaxial substrate | | | |
| Supply voltage | 2.5 V | | | |
| Sampling rate | 5 MS/s | | | |
| Quant. levels | $\geq 2^{12}$ over input range | | | |
| Input range | 1 $V_{PP}$ fully differential | | | |
| SFDR [a] | | | | |
| $f_{in}$ = 9.99093 kHz [b] | 91.4 dB | 75.9 dB | $\geq$90.1 dB, $\geq$88.2 dB | $\geq$77.4 dB |
| $f_{in}$ = 366.007 kHz [c] | 96.4 dB | 83.4 dB | | |
| Wideband [d] SNDR | 90.9 dB | | | |
| $f_{in}$ = 9.99093 kHz [b] | 69.9 dB | 64.8 dB | $\geq$70.6 dB | $\geq$63.7 dB |
| $f_{in}$ = 366.007 kHz [c] | 70.8 dB | 66.6 dB | | |
| Wideband [d] Power | 69.1 dB | | | |
| Analog | 36.8 mW | | $\leq$40.2 mW, $\leq$40.2 mW | |
| Digital | 12.0 mW | | $\leq$20.0 mW, $\leq$20.4 mW | |
| Total dose | Up to 2 Mrad(Si) (measured by 10-MeV protons) | | | |
| Cross section | A = 8.87E−04, c = 49.279, m = 0.89717, $x_0$ = 1.2468 (measured by 10-MeV heavy ions) [f] | | | |
| Latchup | None up to 63 MeV-cm$^2$/mg at 131° C. and 2.7 V supply (measured by 25-MeV heavy ions) | | | |

Table 2 illustrates relative performance of the prototype ADC 800 to commercial ADCs. A list of the currently available ADCs, culled from the most recent Jet Propulsion Laboratory (JPL) A/D Selection Guide (2005), is given in Table 2.

TABLE 2

Comparison with currently available radiation tolerant ADCs

| Bits | Manufacturer | Part | Power (mW) | Sample Rate (MS/s) | SFDR (dB) | SEL (Me V-cm$^2$/mg) | TID (krad (Si)) |
|---|---|---|---|---|---|---|---|
| 12 | Target | | 60 | 5 | 90 | Np Latchup | 100 |
| $\geq$12 | This work | | 60 | 5 | 90 | No Latchup | 1000 |
| | | | 61 | 5 | 88 | Latchup | 2000 |
| 12 | Honeywell | RH9225 | 240 | 20 | 85 | No Latchup | 300 |
| 14 | Analog Devices | AD6644 | 1300 | 65 | 92 | No Latchup | >100 |
| 14 | Analog Devices | AD6645 | 1500 | 105 | 93 | No Latchup | >100 |
| 14 | Analog Devices/ Maxwell | 787IRP | 50 | 0.083 | 88 | No Latchup | 30-100 |
| 16 | Linear Technology | LTC1604 | 220 | 0.333 | 93 | 55-70 | 100 |
| 16 | TI/Maxwell | 7809PTRP | 150 | 0.1 | 100 | No Latchup | 100 |

The prototype ADC 800 is also included ("This work"). It is clear that there exists no other commercial converter that can achieve the desired combination of sampling rate, fidelity, and power consumption represented by the prototype ADC 800. Furthermore, in comparison to the other ADCs that are qualified to, at most, 0.3 Mrad(Si), the prototype ADC 800 maintains performance up to 2 Mrad(Si), nearly an order of magnitude greater. As shown in Table 2, the prototype ADC 800 compares very favorably to current commercial analog-to-digital solutions: in other embodiments, such high SFDR, radiation-tolerant ADCs fill a need not currently addressed.

Figure 9:
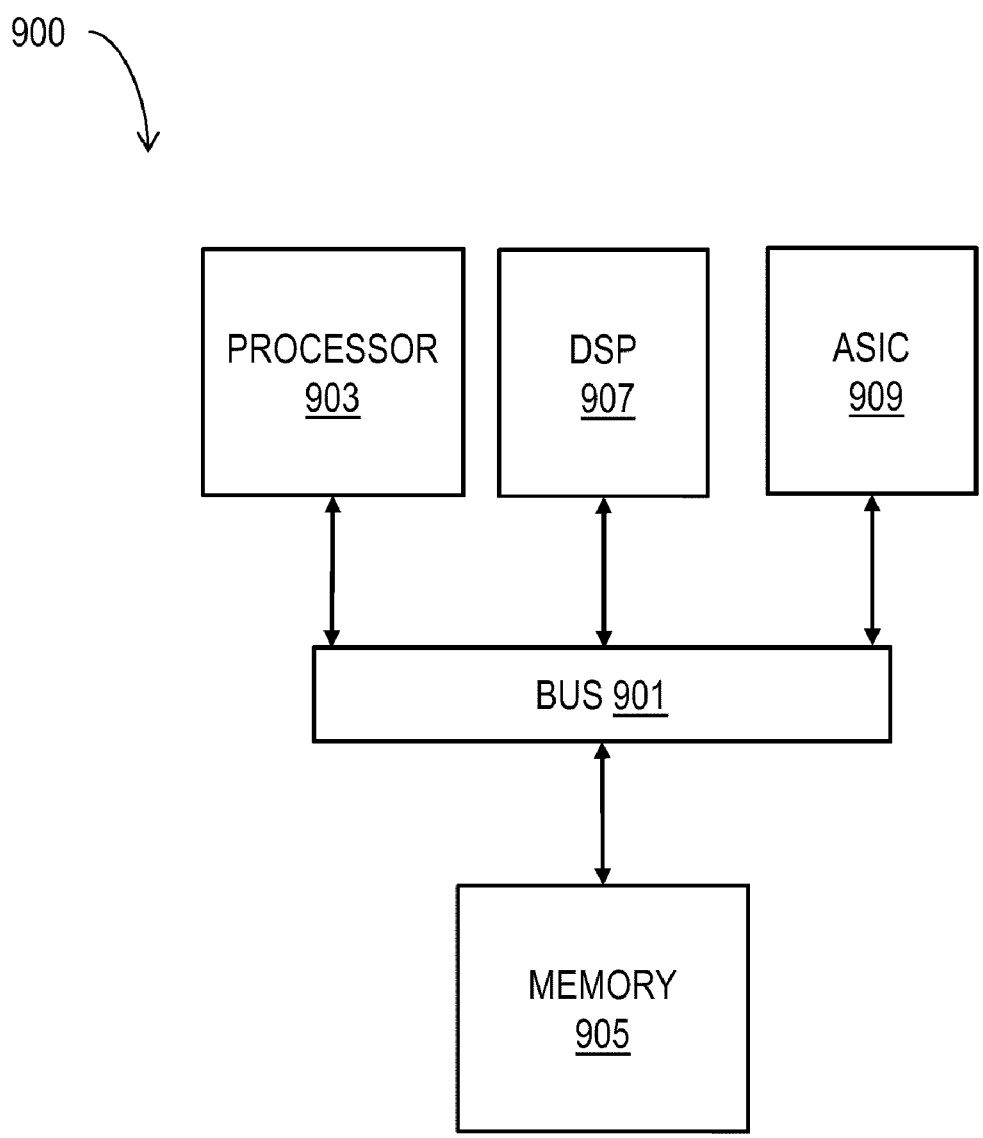
FIG. 9 is a diagram that illustrates a chip set upon which an embodiment of the invention may be implemented.

In some embodiments, the digital reconstruction employs a programmable processor in one or more chip sets. FIG. 9 illustrates a chip set 900 upon which an embodiment of the invention may be implemented. Chip set 900 is programmed to perform some or all of the steps of digital reconstruction as described herein and includes, for instance, a processor and memory components incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 900, or a portion thereof, constitutes a means for performing one or more steps of digital reconstruction.

In some embodiments, the digital reconstruction employs a programmable processor in one or more chip sets. FIG. 9 illustrates a chip set 900 upon which an embodiment of the invention may be implemented. Chip set 900 is programmed to perform some or all of the steps of digital reconstruction as described herein and includes, for instance, a processor and memory components incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 900, or a portion thereof, constitutes a means for performing one or more steps of digital reconstruction.

In one embodiment, the chip set 900 includes a communication mechanism such as a bus 901 for passing information among the components of the chip set 900. A processor 903 has connectivity to the bus 901 to execute instructions and process information stored in, for example, a memory 905. The processor 903 may include one or more processing cores with each core configured to perform independently. A multi-core processor enables multiprocessing within a single physical package. Examples of a multi-core processor include two, four, eight, or greater numbers of processing cores. Alternatively or in addition, the processor 903 may include one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM, magnetic disk, writable optical disk, etc.) and static memory (e.g., ROM, CD-ROM, etc.) for storing executable instructions that when executed perform the inventive steps described herein for digital reconstruction. The memory 905 also stores the data associated with or generated by the execution of the inventive steps.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. An analog-to-digital converter (ADC) comprising a pipeline arrangement of a plurality of analog circuit stages, wherein
    each analog circuit stage produces a residual signal that is within a linear response of a subsequent stage, and
    the ADC provides a spurious-free dynamic range (SFDR) over 90 dB for sampling rates in excess of a megaHertz using less than 120 milliWatts (mW) for all analog circuit stages in the pipeline.

2. An analog-to-digital converter (ADC) as recited in claim 1, wherein a sampling rate is about five megahertz.

3. An analog-to-digital converter (ADC) as recited in claim 1, wherein the ADC uses about 60 mW for all analog circuit stages in the pipeline.

4. An apparatus comprising:
    a plurality of analog circuit stages arranged in series, each analog circuit stage comprising a digital to analog converter subcomponent (sub-DAC) and an analog to digital subcomponent (sub-ADC) and a residue amplifier, wherein
    the sub-ADC is configured to determine, for an input voltage, which of Ni segments of a reference voltage VREFi includes the input voltage, where Ni is an integer number of segments in a transfer function of the ith analog circuit stage of the plurality of analog circuit stages and VREFi is a reference voltage for the ith analog circuit,
    an output of each analog stage is a difference between the input voltage and a nominal voltage generated by the sub-DAC for the segment determined by the sub-ADC amplified by a gain G of the residue amplifier, and
    the number of segments Ni is configured so that the height of a discontinuity between adjacent segments in the transfer function of the ith stage is substantively less than a linear input range of a backend ADC comprising one or more analog circuit stages following the ith analog circuit stage in the plurality of analog circuit stages, wherein a response of the backend ADC is linear for a voltage within the linear input range.

5. An apparatus as recited in claim 4, wherein the residue amplifier is configured to apply a gain G that maximizes the resolution of the plurality of analog circuit stages.

6. An apparatus as recited in claim 4, wherein each analog circuit stage further comprises a calibrated signal module configured to cause a measurement of discontinuity heights between adjacent segments in the transfer function of the analog circuit stage that includes the calibrated signal module.

7. An apparatus as recited in claim 6, further comprising a digital reconstruction chip set configured to update a lookup table that associates a digital output from the sub-ADC for each stage with a correction factor for each segment of the transfer function of the ith analog circuit stage, wherein the update is based on the measurement of discontinuity heights.

8. An apparatus as recited in claim 4, wherein the residue amplifier comprises a switched-capacitor circuit, and an enclosed terminal layout is used for n-channel metal-oxide semiconductor (NMOS) components of the switches in the residue amplifier.

9. An apparatus as recited in claim 8, wherein each NMOS component is oriented so that the enclosed terminal is driven by a low impedance source.

10. An apparatus as recited in claim 4, wherein each of the analog circuit stages comprises self-resetting switched-capacitor circuitry with a strong low-impedance source configured to drive each node of the analog circuit stage periodically to reduce charge accumulation due to radiation strikes.

11. An apparatus as recited in claim 10, wherein the self-resetting switched-capacitor circuitry comprises switches that, when closed, short out input and output terminals of an operational amplifier in the residue amplifier circuit.

12. An apparatus as recited in claim 4, wherein each of the analog circuit stages comprises a plurality of CMOS components and a plurality of guard rings, each guard ring disposed sufficiently near one or more CMOS components to reduce latchup.

13. An apparatus as recited in claim 4, wherein the apparatus further comprises a stack of PMOS diodes configured to provide a source of a master bias current that does not increase with accumulated radiation.

14. An apparatus as recited in claim 4, wherein the apparatus is configured to convert analog input signals to digital output signals with a spurious-free dynamic range (SFDR) over 80 dB.

15. An apparatus as recited in claim 4, wherein the apparatus is configured to convert analog input signals to digital output signals with a spurious-free dynamic range (SFDR) over 90 dB.

16. An apparatus as recited in claim 4, wherein the apparatus is configured to convert analog input signals to digital output signals with a sampling rate that exceeds a megahertz.

17. An apparatus as recited in claim 4, wherein power consumption by the apparatus is less than about 120 milli-Watts.

18. A method comprising:
  determining a gain G of a residue amplifier of a particular analog circuit stage of a plurality of analog circuit stages connected in series in an analog to digital converter (ADC) based on maximizing a resolution of the ADC;
  determining a linear voltage range for a backend ADC comprising one or more analog circuit stages following the particular analog circuit stage in the plurality of analog circuit stages;
  determining a number of segments N for a transfer function of an analog to digital converter subcomponent (sub-ADC) configured to determine, for an input voltage, which of N segments of a reference voltage VREF includes the input voltage, so that a height of a discontinuity between segments in the transfer function is substantively less than a linear voltage range of the backend ADC; and
  fabricating the particular analog circuit stage with the sub-ADC having N segments.

19. A method as recited in claim 18, further comprising repeating steps of claim 18 for a different analog circuit stage in the plurality of analog circuit stages.

* * * * *